(12) United States Patent
Yonemaru

(10) Patent No.: US 6,636,073 B2
(45) Date of Patent: Oct. 21, 2003

(54) SEMICONDUCTOR INTEGRATED CIRCUIT

(75) Inventor: Masashi Yonemaru, Chiba (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/005,351

(22) Filed: Dec. 7, 2001

(65) Prior Publication Data

US 2002/0070409 A1 Jun. 13, 2002

(30) Foreign Application Priority Data

Dec. 8, 2000 (JP) .......................................... 2000-375097

(51) Int. Cl.[7] ................................................ H03K 17/16
(52) U.S. Cl. .............................. 326/87; 326/34; 326/36; 326/119; 326/121; 326/93; 326/95; 326/98; 327/206; 327/216
(58) Field of Search ................................. 326/119, 121, 326/97, 98, 34; 327/200–203, 208, 212–218

(56) References Cited

U.S. PATENT DOCUMENTS 5,107,137 A * 4/1992 Kinugasa et al. ......... 307/272.2
5,175,445 A * 12/1992 Kinugasa et al. ............ 307/451
6,177,826 B1 * 1/2001 Mashiko et al. ............. 327/534

FOREIGN PATENT DOCUMENTS

JP A6-29834 2/1994
JP A11-355123 12/1999

* cited by examiner

*Primary Examiner*—Michael Tokar
*Assistant Examiner*—Vibol Tan
(74) *Attorney, Agent, or Firm*—Birch, Stewart, Kolasch & Birch, LLP

(57) ABSTRACT

A semiconductor integrated circuit of the present invention includes MOSFETs of at least one of N channel- and P channel-types where at least two MOSFETs included in a plurality of MOSFETs, which are provided in a channel between a high potential power line and a low potential power line, includes two serially-connected MOSFETs of the same channel-type in which their respective gates are connected to each other.

15 Claims, 8 Drawing Sheets

SEMICONDUCTOR INTEGRATED CIRCUIT

BACKGROUND OF THE INVENTION

1. Field of the Invention

The present invention relates to an apparatus and a method for analyzing C-V (Capacitance-Voltage) characteristics of a MIS (Metal/Insulator/Semiconductor) structure, and more particularly to an apparatus and a method which can analyze C-V characteristics of a MIS structure including a thin film silicon oxide having the thickness of less than 3 nm.

2. Description of the Related Art

Conventionally, in the case where a logic circuit provided in a semiconductor integrated circuit includes devices a threshold voltage of which is low so as to operate the semiconductor integrated circuit at a low voltage, there is a problem that a leakage current in the semiconductor integrated circuit is increased when the semiconductor integrated circuit is on standby. Japanese Laid-Open Publication No. 6-29834 discloses a logic circuit which includes devices having a high threshold voltage as well as devices having a low threshold voltage, so that a leakage current in a semiconductor integrated circuit including such a logic circuit is decreased when the semiconductor integrated circuit is on standby. An embodiment of this conventional technology is described below with reference to FIG. 10.

FIG. 10 is a circuit diagram illustrating a schematic structure of a conventional semiconductor integrated circuit. The conventional semiconductor integrated circuit includes an inverter logic circuit I100. The inverter logic circuit I100 is connected to a drain of a PMOSFET m100 at its high potential power terminal and is connected to a drain of an NMOSFET m101 at its low potential power terminal. A source of the PMOSFET m100 is connected to a power line Vdd and a source of the NMOSFET m101 is connected to a ground line GND. The PMOSFET m100 receives a control signal CSB at its gate. The NMOSFET m101 receives a control signal CS at its gate. The control signal CS is generated by inverting the control signal CSB.

The inverter logic circuit I100 includes MOSFETs (not shown) having a low threshold voltage so as to operate the inverter logic circuit I100 at a low voltage. A threshold voltage of each of the PMOSFET m100 and the NMOSFET m101 is high. In the inverter logic circuit I100, which is on standby, when a HIGH-state control signal CS and a LOW-state control signal CSB are input to the PMOSFET m100 and the NMOSFET m101, respectively, both of the PMOSFET m100 and the NMOSFET m101 are turned on. At this point, the inverter logic circuit I100 is electrically connected via the PMOSFET m100 to the power line Vdd and is electrically connected via the NMOSFET m101 to the ground line GND. The inverter logic circuit I100 is operated at a low power voltage since the inverter logic circuit I100 includes the MOSFETs having a low threshold voltage.

In the inverter logic circuit I100, which is on standby, when the LOW-state control signal CS and the HIGH-state control signal CSB are input to the PMOSFET m100 and the NMOSFET m101, respectively, both of the PMOSFET m100 and the NMOSFET m101 are turned off. At this point, the inverter logic circuit I100 is electrically disconnected from the power line Vdd and the ground line GND, so that the inverter logic circuit I100 is not operated. A leakage current in the inverter logic circuit I100 is kept low since the threshold voltage of each of the PMOSFET m100 and the NMOSFET m101a is low.

Next, referring to FIG. 11, a conventional technology for controlling a substrate potential of a SOI (silicon on insulator) device so as to operate the SOI device at a low voltage and keep a low leakage current in the SOI device is described below.

FIG. 11 is a circuit diagram illustrating a conventional inverter logic circuit. This conventional inverter logic circuit includes a PMOSFET m102 and an NMOSFET m103. A source of the PMOSFET m102 is connected to a power line Vdd. A gate of the PMOSFET m102 and a gate of the NMOSFET m103 are connected to each other and an input terminal S1 of the conventional inverter logic circuit. A drain of the PMOSFET m102 and a drain of the NMOSFET m103 are connected to each other and an output terminal S2 of the conventional inverter logic circuit. A body (or a backgate when the conventional inverter logic circuit has a bulk structure) of the PMOSFET m102 is connected to the input terminal S1.

A source of the NMOSFET m103 is connected to a ground line GND. The gate of the NMOSFET m103 is connected to the input terminal S1. The drain of the NMOSFET m103 is connected to the drain of the PMOSFET m102 and the output terminal S2. A body (or a backgate when the conventional inverter logic circuit has a bulk structure) of the NMOSFET m103 is connected to the input terminal S1.

When a state of a control signal input via the input terminal S1 is changed from LOW to HIGH, a body (substrate) potential of the NMOSFET m103 is also changed from LOW to HIGH, so that a threshold voltage of the NMOSFET m103 is decreased. Thus, the NMOSFET m103 is rapidly turned on and is operated at high speed.

In this case, a gate potential and a body potential of the PMOSFET m102 are changed from LOW to HIGH, and the PMOSFET m102 is turned off, so that a threshold voltage of the PMOSFET m102 is increased. Similarly, when a state of a control signal input to the PMOSFET m102 is changed from HIGH to LOW, a body potential of the PMOSFET m102 is changed from LOW to HIGH, so that a threshold voltage of the PMOSFET m102 is decreased. Thus, the PMOSFET m102 is rapidly turned on and is operated at high speed.

In this case, a gate potential and a body potential of the NMOSFET m103 are changed from HIGH to LOW, and the NMOSFET m103 is turned off, so that a threshold voltage of the NMOSFET m103 is increased. In this manner, the threshold voltage of each of the PMOSFET m102 and the NMOSFET m103 is decreased when the PMOSFET m102 and the NMOSFET m103 are turned on and is increased when the PMOSFET m102 and the NMOSFET m103 are turned off, and thus the SOI device can be operated at a low voltage, and a leakage current in the SOI device can be kept low.

However, the above-described conventional technologies have the following problems.

In the conventional technology described with reference to FIG. 10, it is necessary to include MOSFETs having a high threshold voltage in the semiconductor integrated circuit in order to decrease a leakage current in the semiconductor integrated circuit when the semiconductor integrated circuit is on standby. Specifically, in order to operate the semiconductor integrated circuit at a low voltage and maintain a low leakage current in the semiconductor integrated circuit, it is necessary to form MOSFETs, each operable at a threshold voltage differing from that of the other, on the same semiconductor substrate. However, this results in a complicated production process of the semiconductor integrated circuit. Moreover, a control signal is required to be input to the semiconductor integrated circuit so as to cause the semiconductor integrated circuit to be on standby, and when the semiconductor integrated circuit is on standby, a logic circuit provided in the semiconductor integrated circuit is electrically disconnected from a power source and is not operated. Therefore, it is not appropriate to apply the conventional technology to a circuit (e.g., a flip-flop circuit, a memory, etc.) for storing data.

In the conventional technology described with reference to FIG. 11, it is necessary to provide electrodes connected to MOSFET bodies in the semiconductor integrated circuit in order to change a body potential of the MOSFETs, and thus a total area of the semiconductor integrated circuit is increased. Since it is necessary to control the body potential of the MOSFETs, this conventional technology can only be applied to PD-type (partial depletion-type) FETs and cannot be applied to FD-type (full depletion-type) FETs.

SUMMARY OF THE INVENTION

A semiconductor integrated circuit according to the present invention has the following features for solving the above-described problems of the conventional technologies.

(1) A semiconductor integrated circuit according to the present invention includes MOSFETs of at least one of N channel- and P channel-types where at least two MOSFETs included in a plurality of MOSFETs, which are provided in a channel between a high potential power line and a low potential power line, includes two serially-connected MOSFETs of the same channel-type in which their respective gates are connected to each other.

In the above-described structure, the semiconductor integrated circuit includes MOSFETs of at least one of N channel- and P channel-types where at least two MOSFETs included in a plurality of MOSFETs, which are provided in a channel between a high potential power line and a low potential power line, includes two serially-connected MOSFETs of the same channel-type in which their respective gates are connected to each other.

Accordingly, a leakage current flowing through the semiconductor integrated circuit can be greatly decreased, so that a leakage current in the semiconductor integrated circuit, when not in operation, can be decreased. Moreover, the leakage current flowing through the semiconductor integrated circuit can be decreased even if the semiconductor integrated circuit is produced by an ordinary integrated circuit production process without requiring any specific step, e.g., a step for adding MOSFETs, which operate at a high threshold voltage, to the semiconductor integrated circuit, a step for controlling a substrate voltage so as to change a threshold voltage of MOSFETs, etc. In this case, the semiconductor integrated circuit includes only FETs having an extremely low threshold voltage, and thus the semiconductor integrated circuit can be stably operated at an extremely low power voltage.

(2) The semiconductor integrated circuit according to the present invention may include a circuit which includes at least two MOSFETs of the same channel-type where the circuit is any one of a logic circuit, a data storing circuit, and a buffer circuit included in a pass transistor logic circuit.

In the above-described structure, the semiconductor integrated circuit includes any one of a logic circuit, a data storing circuit, and a buffer circuit included in a pass transistor logic circuit, and a circuit to be included in the semiconductor integrated circuit includes at least two serially-connected MOSFETs having the same channel-type in which their respective gate electrodes are connected to each other.

Accordingly, a leakage current flowing through the semiconductor integrated circuit can be greatly decreased, so that a leakage current in the semiconductor integrated circuit, when not in operation, can be decreased. Moreover, no specific signal is required for causing the semiconductor integrated circuit to be placed on standby. Moreover, the semiconductor integrated circuit includes MOSFETs which operate at an extremely low threshold voltage, and thus no additional specific circuitry is used in the semiconductor integrated circuit. Accordingly, the semiconductor integrated circuit can be operated at an extremely low voltage so as to retain data.

(3) In the semiconductor integrated circuit according to the present invention, a gate length of each of the two MOSFETs of the same channel-type may be longer than respective gate lengths of other MOSFETs included in the plurality of MOSFETs provided in the channel.

In the above-described structure, the semiconductor integrated circuit includes two MOSFETs of the same channel-type each having a gate length which is longer than respective gate lengths of other MOSFETs included in the plurality of MOSFETs provided in the channel, and the two MOSFETs of the same channel-type are serially connected such that their respective gate electrodes are connected to each other.

Accordingly, a leakage current which may flow through the semiconductor integrated circuit can be decreased.

(4) A semiconductor integrated circuit according to the present invention includes MOSFETs of at least one type of N channel- and P channel-types where at least one set of MOSFETs included in a plurality of MOSFETs, which are provided in a channel between a high potential power line and a low potential power line, includes first through third MOSFETs of the same channel-type, the first through third MOSFETs being serially connected, respective gate electrodes of the first and third MOSFETs being connected to each other, and a gate electrode of the second MOSFET being connected to a section of the semiconductor integrated circuit which has a sufficient potential to turn on the second MOSFET.

In the above-described structure, the semiconductor integrated circuit includes MOSFETs of at least one type of N channel- and P channel-types where at least one set of MOSFETs included in a plurality of MOSFETs, which are provided in a channel between a high potential power line and a low potential power line, includes first through third MOSFETs having the same channel-type, the first through third MOSFETs being serially connected, respective gate electrodes of the first and third MOSFETs being connected to each other, and a gate electrode of the second MOSFET being connected to a section of the semiconductor integrated circuit which has a sufficient potential to turn on the second MOSFET.

Accordingly, the first MOSFET has load resistances provided by the second and third MOSFETs, and thus a leakage current flowing through the semiconductor integrated circuit can be extremely low. Moreover, the leakage current flowing through the semiconductor integrated circuit can be decreased even if the semiconductor integrated circuit is produced by an ordinary integrated circuit production process without requiring any additional specific steps, e.g., a step for adding MOSFETs which operate at a high threshold voltage to the semiconductor integrated circuit, and a step for controlling a substrate voltage so as to change a threshold voltage of the MOSFETs. In this case, the semiconductor integrated circuit includes only FETs having a threshold voltage which is extremely low, and thus the semiconductor integrated circuit can be stably operated at an extremely low power voltage.

(5) A semiconductor integrated circuit according to the present invention includes MOSFETs of at least one of N channel- and P channel-types where at least one set of MOSFETs included in a plurality of MOSFETs, which are provided in a channel between a high potential power line and a low potential power line, includes first through third MOSFETs of the same channel-type, the first through third MOSFETs being serially connected, respective gate electrodes of the first and third MOSFETs being connected to each other, and a gate electrode of the second MOSFET receiving a control signal differing from that input to the respective gate electrodes of the first and third MOSFETs.

In the above-described structure, the semiconductor integrated circuit includes MOSFETs of at least one of N channel- and P channel-types where at least one set of MOSFETs included in a plurality of MOSFETs, which are provided in a channel between a high potential power line and a low potential power line, includes first through third MOSFETs having the same channel-type, the first through third MOSFETs being serially connected, respective gate electrodes of the first and third MOSFETs being connected to each other, and a gate electrode of the second MOSFET receiving a control signal differing from that input to the respective gate electrodes of the first and third MOSFETs.

Accordingly, the first MOSFET has load resistances provided by the second and third MOSFETs, and thus a leakage current flowing through the semiconductor integrated circuit can be extremely low. Moreover, the leakage current flowing through the semiconductor integrated circuit can be decreased even if the semiconductor integrated circuit is produced by an ordinary integrated circuit production process without requiring any additional specific steps, e.g., a step for adding MOSFETs which operate at a high threshold voltage to the semiconductor integrated circuit, and a step for controlling a substrate voltage so as to change a threshold voltage of the MOSFETs. In this case, the semiconductor integrated circuit includes only FETs having a threshold voltage which is extremely low, and thus the semiconductor integrated circuit can be stably operated at an extremely low power voltage.

(6) The semiconductor integrated circuit according to the present invention may include a circuit which includes at least one set of the first through third MOSFETs of the same channel-type where the circuit is any one of a logic circuit, a data storing circuit, and a buffer circuit included in a pass transistor logic circuit.

In the above-described structure, the semiconductor integrated circuit includes a circuit which includes at least one set of the first through third MOSFETs having the same channel-type, in which the circuit is any one of a logic circuit, a data storing circuit, and a buffer circuit included in a pass transistor logic circuit.

Accordingly, a leakage current flowing through the semiconductor integrated circuit can be greatly decreased, so that a leakage current in the semiconductor integrated circuit, when not in operation, can be decreased. Moreover, no specific signal is required for causing the semiconductor integrated circuit to be placed on standby. Moreover, the semiconductor integrated circuit includes MOSFETs which operate at an extremely low threshold voltage, and thus no additional specific circuitry is used in the semiconductor integrated circuit. Accordingly, the semiconductor integrated circuit can be operated at an extremely low voltage so as to retain data.

(7) In the semiconductor integrated circuit according to the present invnetion, a gate length of the second MOSFET may be longer than respective gate lengths of the first and third MOSFETs included in the plurality of MOSFETs provided in the channel.

In the above-described structure of the semiconductor integrated circuit, a gate length of the second MOSFET is longer than respective gate lengths of the first and third MOSFETs included in the plurality of MOSFETs provided in the channel.

Accordingly, even if the respective gate lengths of the first and third MOSFETs are not increased, a leakage current flowing through the semiconductor integrated circuit can be decreased by adjusting the gate length of the second MOSFET.

(8) The semiconductor integrated circuit according to the present invention may be formed on a SOI substrate.

The semiconductor integrated circuit according to the present invention is formed on a SOI substrate.

Accordingly, the present invention is highly advantageous as a technology for realizing a circuit which is operated at low voltage and has a low leakage current without performing threshold control by substrate bias control or without using a multi-threshold device technology in which a high threshold device is additionally used for a circuit including such a device to have low leakage current characteristics.

Thus, the invention described herein makes possible the advantages of providing a semiconductor integrated circuit which can be produced by a simple production process, rather than a complicated production process, but can be operated at low voltage and in which a leakage current can be kept low when the semiconductor integrated circuit is on standby.

These and other advantages of the present invention will become apparent to those skilled in the art upon reading and understanding the following detailed description with reference to the accompanying figures.

DESCRIPTION OF THE PREFERRED EMBODIMENTS

Hereinafter, embodiments of the present invention will be described with reference to the drawings.
(Embodiment 1)

Figure 1A:
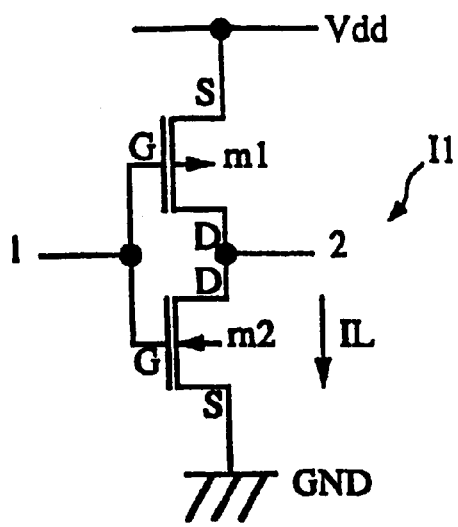
FIG. 1A is a diagram illustrating a structure of an inverter logic circuit I1 according to Embodiment 1 of the present invention.

FIG. 1A is a circuit diagram illustrating a structure of an inverter logic circuit included in a semiconductor integrated circuit according to Embodiment 1 of the present invention. Examples of an inverter logic circuit to which the present invention is applied is described below.

FIG. 1A illustrates a structure of an inverter logic circuit I1 according to Embodiment 1 of the present invention. The inverter logic circuit I1 includes a PMOSFET (a P channel-type MOS field effect transistor) m1 and an NMOSFET (an N channel-type MOS field effect transistor) m2. A source of the PMOSFET m1 is connected to a power line Vdd which is a high potential power line. A gate of the PMOSFET m1 is connected to an input terminal 1 of the inverter logic circuit I1. A drain of the PMOSFET m1 is connected to a drain of the NMOSFET m2 and an output terminal 2 of the inverter logic circuit I1.

A source of the NMOSFET m2 is connected to a ground line GND which is a low potential power line. A gate of the NMOSFET m2 is connected to the input terminal 1. The drain of the NMOSFET m2 is connected to the drain of the PMOSFET m1 and the output terminal 2.

Figure 1B:
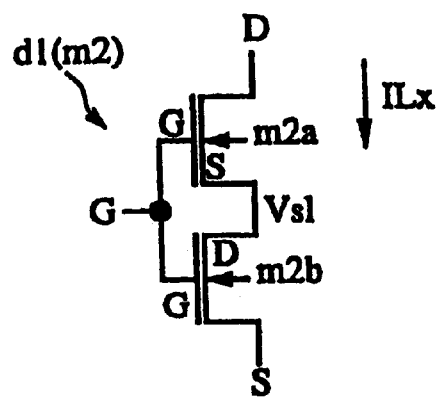
FIG. 1B is a diagram illustrating a structure of an NMOSFET m2 according to Embodiment 1 of the present invention.

FIG. 1B illustrates a structure of the NMOSFET m2. The NMOSFET m2 includes an NMOSFET m2a and an NMOSFET m2b. The NMOSFET m2a and the NMOSFET m2b are serially connected to each other, and the respective gates of the NMOSFET m2a and the NMOSFET m2b are connected to each other (hereinafter, this structure is referred to as "a serial homogeneous FET d1"). In the serial homogeneous FET d1, a source of the NMOSFET m2a is connected to a drain of the NMOSFET m2b. The respective gates of the NMOSFET m2a and the NMOSFET m2b are connected to the input terminal 1 (FIG. 1A). A drain of the NMOSFET m2a is connected to the drain of the PMOSFET m1 and is further connected to the output terminal 2 (FIG. 1A). A source of the NMOSFET m2b is connected to the ground line GND (FIG. 1A).

When the input terminal 1 of the inverter logic circuit I1 illustrated in FIG. 1A receives a LOW-state control signal, the PMOSFET m1 is turned on and the NMOSFET m2 is turned off, so that a HIGH-state signal is supplied to the output terminal 2. In this case, in order to operate the inverter logic circuit I1 at an extremely low voltage, a threshold voltage of each of the PMOSFET m1 and the NMOSFET m2 included in the inverter logic circuit I1 is set so as to be much lower than those of conventional FETs. Specifically, a threshold voltage of a conventional FET is approximately 0.35 V and the threshold voltage of each of the PMOSFET m1 and the NMOSFET m2 included in the inverter logic circuit I1 is set so as to be approximately 0.15 V. However, in the case where the threshold voltage of each of the PMOSFET m1 and the NMOSFET m2 is set so as to be extremely low, a leakage current in the inverter logic circuit I1 is increased when the inverter logic circuit I1 is in an OFF state. Hereinafter, a leakage current in a circuit which is in an OFF state is referred to as "an off-leakage current".

However, in Embodiment 1 of the present invention, the NMOSFET m2 includes the serial homogeneous FET d1, so that a leakage current in the inverter logic circuit I1 can be decreased. The following description relates to the reasons for this.

Figure 2A:
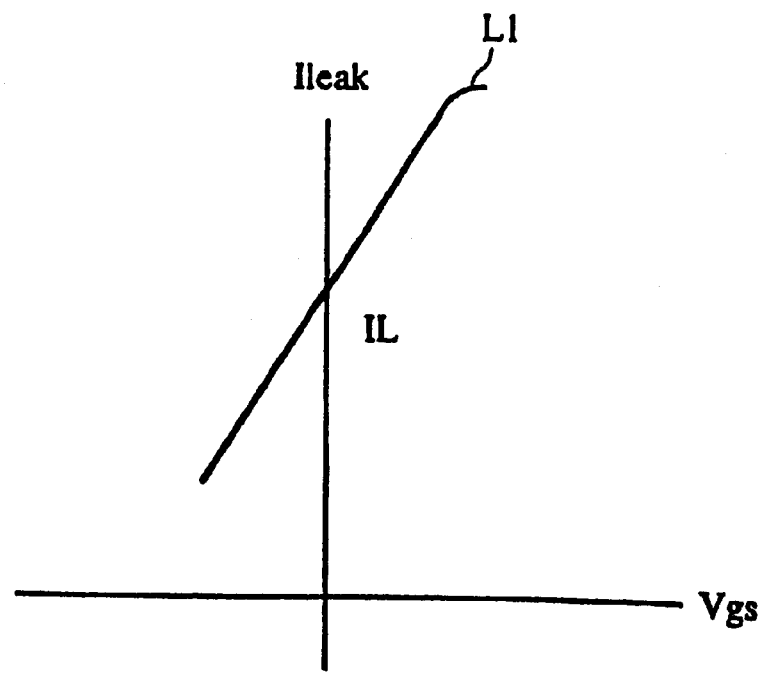
FIG. 2A is a graph illustrating characteristics of an off-leakage current in a conventional case where a single MOSFET is used in place of the NMOSFET m2 according to Embodiment 1 of the present invention.

FIG. 2A is a graph illustrating characteristics of an off-leakage current in a conventional case where a single MOSFET is used in place of the NMOSFET m2 according to Embodiment 1 of the present invention.

Figure 2B:
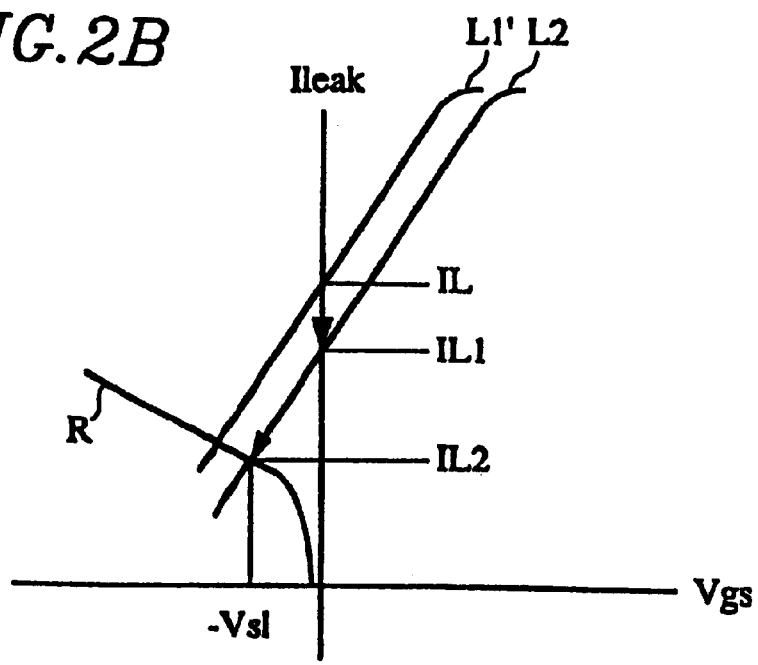
FIG. 2B is a graph illustrating characteristics of an off-leakage current in a case of Embodiment 1 of the present invention where the NMOSFET m2 includes serially-connected NMOSFETS.

FIG. 2B is a graph illustrating characteristics of an off-leakage current in the case of Embodiment 1 of the present invention where the NMOSFET m2 includes the serially-connected NMOSFETs m2a and m2b.

In FIGS. 2A and 2B, the horizontal axis indicates a gate voltage Vgs applied to a MOSFET and the vertical axis indicates a leakage current Ileak in a MOSFET.

In the conventional case, in order to operate an inverting logic circuit at low voltage, a threshold voltage of the conventional MOSFET included in the inverting logic circuit is set so as to be low, so that a leakage current of the conventional MOSFET has the characteristic L1 shown in FIG. 2A. In this case, when an input terminal of the inverting logic circuit receives a LOW-state control signal, a gate voltage Vgs applied to the conventional MOSFET is 0 and a leakage current Ileak in the conventional MOSFET is IL.

In the case of Embodiment 1, a threshold voltage of each of the PMOSFET m1 and the NMOSFET m2 included in the inverter logic circuit I1 is set so as to be low, so that a leakage current in each of the PMOSFET m1 and the NMOSFET m2 has the characteristic L1' shown in FIG. 2B, which is similar to the leakage current characteristic L1 of the conventional circuit shown in FIG. 2A. However, the NMOSFET m2 includes the serially-connected NMOSFETs m2a and m2b, and thus a voltage applied to the NMOSFET m2 is divided. As a result, a source potential of the NMOSFET m2a has a value represented as Vs1. In this case, due to the bias of the substrate of the NMOSFET m2, the leakage current in the NMOSFET m2 is decreased to IL1 (leakage current characteristic L2) shown in FIG. 2B. Moreover, the NMOSFET m2*b* is a load and has load characteristics as represented by a load curve R shown in FIG. 2B. As a result, a gate potential of the NMOSFET m2*a* is 0 and a source potential of the NMOSFET m2*a* is Vs1. Accordingly, a gate voltage Vgs applied to the NMOSFET m2*a* is −Vs1.

Thus, the leakage current flowing through the NMOSFET m2*a* is decreased to a current value IL2 which is an intersection point of the load curve R of the NMOSFET m2*b* and the leakage current characteristic L2. Thus, in the inverter logic circuit I1 according to Embodiment 1 of the present invention including the serially-connected PMOSFET m1 and NMOSFET m2, a value of the leakage current in the NMOSFET m2 is IL2.

As described above, in the case where the MOSFET m2 includes two serially-connected MOSFETs, i.e., the PMOSFET m1 and the NMOSFET m2, a leakage current in the inverting logic circuit I1 can be greatly decreased to IL2 in comparison with a leakage current in the conventional single MOSFET, so that a leakage current in the semiconductor integrated circuit including the inverter logic circuit I1, when not in operation, can be decreased. Moreover, the leakage current in the semiconductor integrated circuit can be decreased even if the semiconductor integrated circuit is produced by an ordinary integrated circuit production process without requiring any additional specific steps, e.g., a step for adding FETs having a high threshold voltage to the semiconductor integrated circuit, and a step for controlling a substrate voltage so as to change a threshold voltage of the FETs. In this case, the semiconductor integrated circuit includes only FETs having extremely low threshold voltages, and thus the semiconductor integrated circuit can be stably operated at extremely low power voltages.

The leakage current characteristics of the semiconductor integrated circuit which is on standby can be adjusted by changing the form of the serially-connected NMOSFEETs m2*a* and m2*b* illustrated in FIG. 1B.

Figure 3:
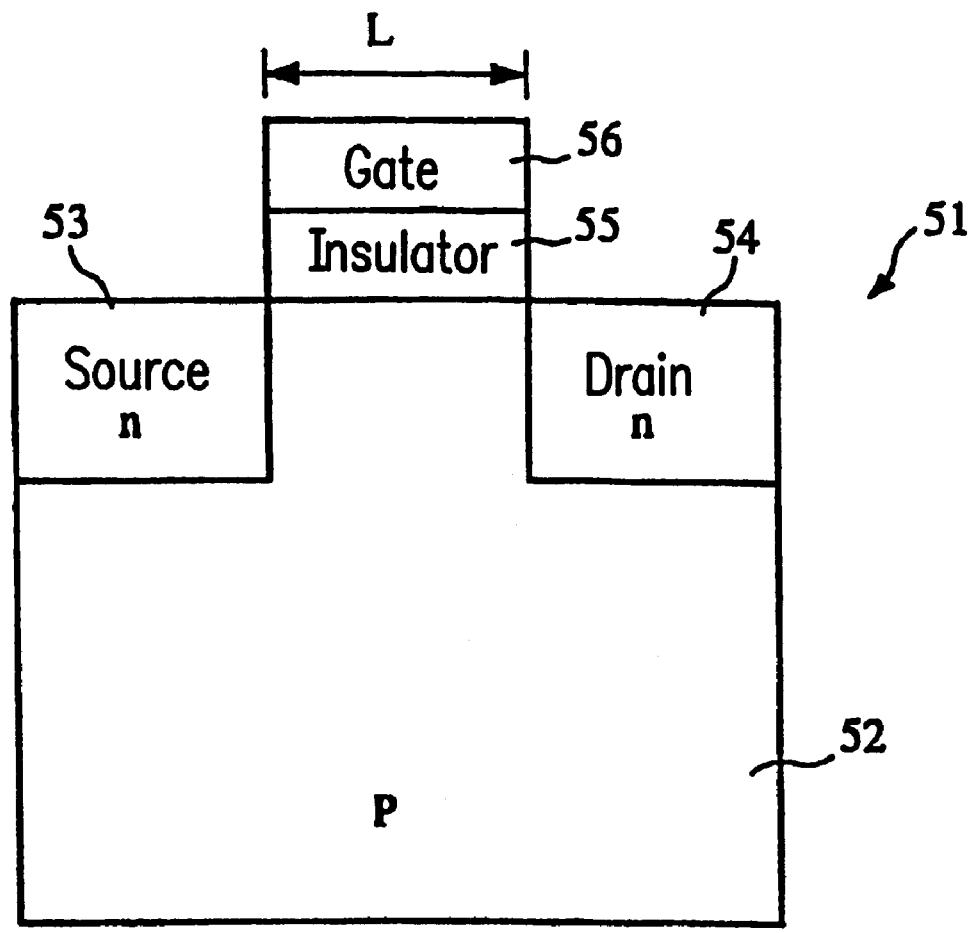
FIG. 3 is a schematic diagram illustrating a structure of an NMOSFET 51 according to Embodiment 1 of the present invention.

FIG. 3 is a schematic diagram illustrating a structure of an NMOSFET 51 which is used as an example for explaining effects of an increase in gate length of a FET.

The NMOSFET 51 includes a p-type silicon region 52, an n-type source region 53, an n-type drain region 54, an insulator 55, and a gate 56. The n-type source region 53 and the n-type drain region 54 are located in the p-type silicon region 52 in the vicinity of a surface of the p-type silicon region 52. The insulator 55 is disposed between the p-type silicon region 52 and the gate 56.

In Embodiment 1 of the present invention, when a gate length L of the NMOSFET 51 is increased so as to be longer than that of a conventional NMOSFET or other MOSFETs provided in the same semiconductor integrated circuit, a leakage current in the semiconductor integrated circuit can be decreased. When the gate length L of the NMOSFET 51 is increased, a variation in a saturation current during operation of the NMOSFET 51 causes a variation in a propagation delay of an inverter circuit including the NMOSFET 51. However, the gate length L of the NMOSFET 51 can be adjusted so as to satisfy desired leakage current characteristics and desired propagation delay characteristics, i.e., the NMOSFET 51 can be designed so as to decrease a leakage current and satisfy propagation delay characteristic requirements, so that it is possible to attain satisfactory effects.

An example of applying the serial homogeneous FET d1 illustrated in FIG. 1B to a D flip-flop circuit, which is a data storing circuit, is described with reference to FIGS. 4A and 4B.

Figure 4A:
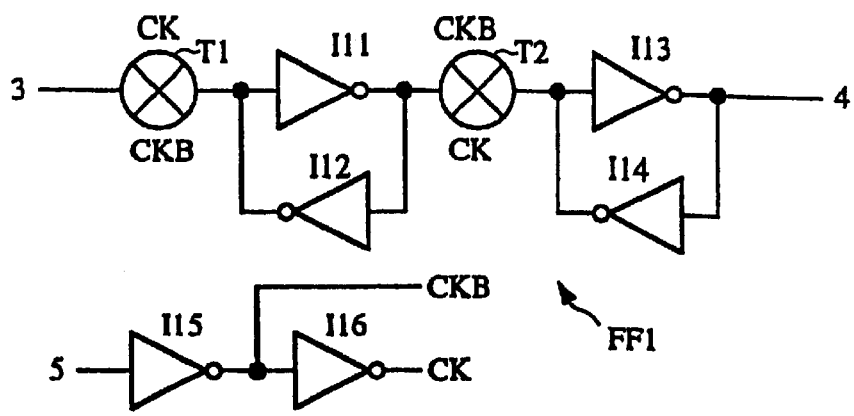
FIG. 4A is a diagram illustrating a structure of a D flip-flop circuit FF1 according to Embodiment 1 of the present invention.

FIG. 4A illustrates a structure of a D flip-flop circuit FF1. FIG. 4B illustrate a structure of a transmission gate.

The D flip-flop circuit FF1 of FIG. 4A includes a data input terminal 3, a data output terminal 4 a clock signal input terminal 5, transmission gates T1 and T2, and inverter logic circuits I11, I12, I13, I14, I15, and I16.

The data input terminal 3 is connected to an input terminal of the transmission gate T1. The data output terminal 4 is connected to an output terminal of the inverter logic circuit I13 and an input terminal of the inverter logic circuit I14. The clock signal input terminal 5 is connected to an input terminal of the inverter logic circuit I15. An output terminal of the transmission gate T1 is connected to an input terminal of the inverter logic circuit I11 and an output terminal of the inverter logic circuit I12. An output terminal of the inverter logic circuit I11 and an input terminal of the inverter logic circuit I12 are both connected to an input terminal of the transmission gate T2. An output terminal of the transmission gate T2 is connected to an input terminal of the inverter logic circuit I13 and an output terminal of the inverter logic circuit I14. An output terminal of the inverter logic circuit I15 and an input terminal of the inverter logic circuit I16 are both connected to control terminals CKB of the transmission gates T1 and T2. An output terminal of the inverter logic circuit I16 is connected to control terminals CK of the transmission gates T1 and T2.

In the D flip-flop circuit FF1, the inverter logic circuits I11 and I12 serve together as a data retainer circuit which is a master stage, and the inverter logic circuits I13 and I14 serve together as a data retainer circuit which is a slave stage. The inverter logic circuits I15 and I16 serve as a clock signal generator circuit.

Figure 4B:
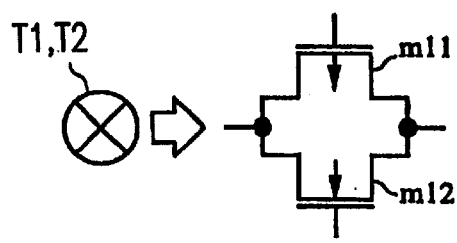
FIG. 4B is a circuit diagram illustrating a structure of a transmission gate according to Embodiment 1 of the present invention.

As illustrated in FIG. 4B, each of the transmission gates T1 and T2 includes a PMOSFET m11 and an NMOSFET m12 which are connected in parallel to each other. A source of the PMOSFET m11 is connected to a drain of the NMOSFET m12. A drain of the PMOSFET m11 is connected to a source of the NMOSFET m12. A gate of the PMOSFET m11 is a control terminal CK, and a gate of the NMOSFET m12 is a control terminal CKB.

Respective structures of the inverter logic circuits I11–I16 are the same as the structure of the inverter logic circuit I1 illustrated in FIG. 1A. In the D flip-flop circuit FF1, each of the inverter logic circuits I11–I14 includes a serial homogeneous FET (e.g., FIG. 1B). Thus, as described above with reference to FIG. 2, a leakage current in the D flip-flop circuit FF1 can be decreased. Moreover, no specific signal is required for causing the D flip-flop circuit FF1 to be placed on standby, and thus it is possible to decrease an unwanted leakage current in the D flip-flop circuit FF1 when not in operation. It is also possible to operate the D flip-flop circuit FF1 at an extremely low voltage so as to retain data.

A case where Embodiment 1 of the present invention is applied to a pass transistor logic circuit is described below with reference to FIG. 5.

Figure 5:
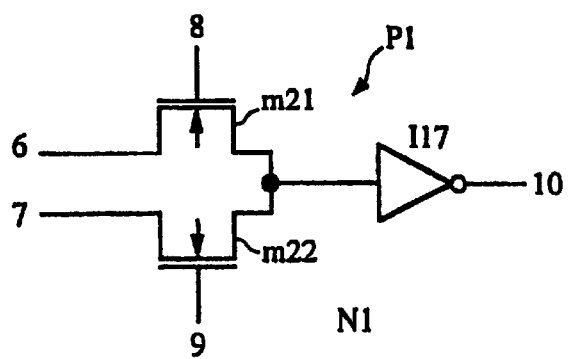
FIG. 5 is a circuit diagram illustrating a structure of a pass transistor logic circuit according to Embodiment 1 of the present invention.

FIG. 5 illustrates a structure of a pass transistor logic circuit P1. The pass transistor logic circuit P1 includes an NMOSFET m21, an NMOSFET m22, a buffer (inverter logic) circuit I17, signal input terminals 6, 7, 8 and 9, and an output terminal 10. A drain of the PMOSFET m21 is connected to the signal input terminal 6. A gate of the PMOSFET m21 is connected to the signal input terminal 8. A source of the PMOSFET m21 is connected to an input terminal of the buffer circuit I17. A drain of the PMOSFET m22 is connected to the signal input terminal 7. A gate of the PMOSFET m22 is connected to the signal input terminal 9. A source of the PMOSFET m22 is connected to the input terminal of the buffer circuit I17. An output terminal of the buffer circuit I17 is connected to the signal output terminal 10.

The pass transistor logic circuit P1 receives a logic signal output from other circuits in the same circuit network. The pass transistor logic circuit P1 amplifies the logic signal in an inverting manner using the buffer circuit I17 and outputs it to a circuit in a subsequent stage. By applying the inverter logic circuit I1 including the serial homogeneous FET illustrated in FIG. 1B to the buffer circuit I17, in a similar manner to the examples described above, it is possible to operate the pass transistor logic circuit P1 at an extremely low voltage and to decrease a leakage current in the pass transistor logic circuit P1 without additionally using any specific circuits, devices, or control signals.

In each of the above-described examples, by using a serial homogeneous FET only for a MOSFET corresponding to the NMOSFET m2 of the inverter circuit I1, a leakage current in a semiconductor integrated circuit can be decreased while such a semiconductor integrated circuit can be operated at low voltage. In the inverter circuit I1 (or corresponding circuits in the different examples), no measures to decrease an off-leakage current in the PMOSFET m1 (or corresponding MOSFETs) are taken. As for the NMOSFET m2, by using a serial homogeneous FET for the PMOSFET m1 (or corresponding MOSFETs), it is possible to further decrease a leakage current in a semiconductor integrated circuit including the PMOSFET m1 (or the corresponding MOSFETs).

Figure 1C:
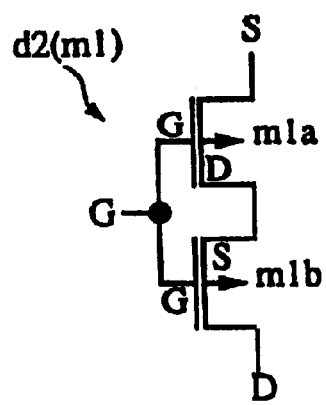
FIG. 1C is a diagram illustrating a structure of a PMOSFET m1 according to Embodiment 1 of the present invention.

FIG. 1C illustrates a structure of the PMOSFET m1. The PMOSFET m1 includes a PMOSFET m1a and a PMOSFET m1b. The PMOSFET m1a and the PMOSFET m1b are serially connected to each other, and the respective gates of the PMOSFET m1a and the PMOSFET m1b are connected to each other (hereinafter, this structure is referred to as "a serial homogeneous FET d2"). In the serial homogeneous FET d2, a drain of the PMOSFET m1a is connected to a source of the PMOSFET m1b. The respective gates of the PMOSFET m1a and the PMOSFET m1b are connected to the input terminal 1 (FIG. 1A). A drain of the PMOSFET m1b is connected to the output terminal 2 (FIG. 1A). A source of the PMOSFET m1a is connected to the power line Vdd (FIG. 1A).

In Embodiment 1, if there is a possibility that either of the NMOSFET m2 or the PMOSFET m1 is turned off during a standby operation of the semiconductor integrated circuit including the NMOSFET m2 and the PMOSFET m1, the serial homogeneous FET d1 illustrated in FIG. 1B or the serial homogeneous FET d2 illustrated in FIG. 1C is applied to the one(s) to be turned off. This allows a decrease of a leakage current in the semiconductor integrated circuit while there is a minimum increase in an area of the semiconductor integrated circuit.

(Embodiment 2)

A semiconductor integrated circuit according to Embodiment 2 of the present invention is described using examples of inverter logic circuits included in the semiconductor integrated circuit to which the present invention is applied.

Figure 6A:
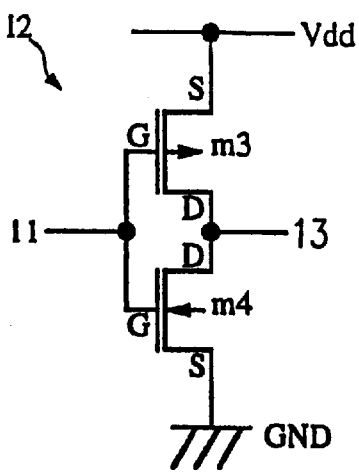
FIG. 6A is a diagram illustrating a structure of an inverter logic circuit I2 according to Embodiment 2 of the present invention.

FIG. 6A illustrates a structure of an inverter logic circuit I2 according to Embodiment 2 of the present invention. The inverter logic circuit I2 includes a PMOSFET m3 and an NMOSFET m4. A source of the PMOSFET m3 is connected to a power line Vdd which is a high potential power line. A gate of the PMOSFET m3 is connected to an input terminal 11 of the inverter logic circuit I2. A drain of the PMOSFET m3 is connected to a drain of the NMOSFET m4 and an output terminal 13 of the inverter logic circuit I2.

A source of the NMOSFET m4 is connected to a ground line GND which is a low potential power line. A gate of the NMOSFET m4 is connected to the input terminal 11. The drain of the NMOSFET m4 is connected to the drain of the PMOSFET m3 and the output terminal 13.

Figure 6B:
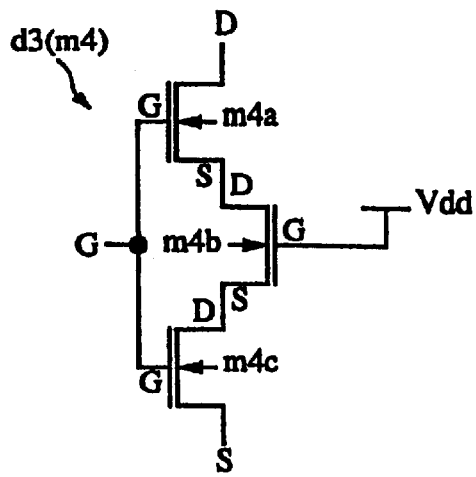
FIG. 6B is a diagram illustrating a structure of an NMOSFET m4 according to Embodiment 2 of the present invention.

FIG. 6B illustrates a structure of the NMOSFET m4. The NMOSFET m4 includes three serially-connected MOSFETs of the same channel-type: an NMOSFET m4a (a first MOSFET); an NMOSFET m4b (a second MOSFET); and an NMOSFET m4c (a third MOSFET). The NMOSFET m4a and the NMOSFET m4c are serially connected to each other, and the respective gates of the NMOSFET m4a and the NMOSFET m4c are connected to each other (hereinafter, this structure is referred to as "a serial homogeneous FET d3"). In the serial homogeneous FET d3, a source of the NMOSFET m4a is connected to a drain of the NMOSFET m4b. A source of the NMOSFET m4b is connected to a drain of the NMOSFET m4c. The respective gates of the NMOSFET m4a and the NMOSFET m4c are connected to the input terminal 11 (FIG. 6A). A drain of the NMOSFET m4a is connected to the output terminal 13 (FIG. 6A). A source of the NMOSFET m4c is connected to the ground line GND (FIG. 6A). A gate of the NMOSFET m4b is connected to the power line Vdd which has a sufficient potential to turn on the NMOSFET m4b.

When the input terminal 11 of the inverter logic circuit I2 illustrated in FIG. 6A receives a LOW-state control signal, the PMOSFET m3 is turned on and the NMOSFET m4 is turned off, so that a HIGH-state signal is supplied to the output terminal 13. In this case, in order to operate the inverter logic circuit I2 at an extremely low voltage, a threshold voltage of each of the PMOSFET m3 and the NMOSFET m4 included in the inverter logic circuit I2 is set so as to be extremely low, as in the case of Embodiment 1. However, in the case where the threshold voltage of each of the PMOSFET m3 and the NMOSFET m4 is set so as to be extremely low, an off-leakage current in the inverter logic circuit I2 is increased.

However, in Embodiment 2 of the present invention, the NMOSFET m4 includes the serial homogeneous FET d3 as illustrated in FIG. 6B. Accordingly, the NMOSFET m4b and the NMOSFET m4c are loads of the NMOSFET m4a. In this case, a leakage current flowing through the inverter logic circuit I2 is extremely low in comparison to the case where the NMOSFET m4 is a single MOSFET or the case where the NMOSFET m4 is the serial homogeneous FET d1 (FIG. 1B). Specifically, in Embodiment 2 of the present invention, load capacitance of the gate of the NMOSFET m4 is the sum of gate capacitance of two MOSFETs (i.e., the NMOSFET m4a and the NMOSFET m4c) as in the case described with reference to FIG. 1B, and the ON-resistance of the NMOSFET m4b is added to the NMOSFET m4, so that a leakage current in the inverter logic circuit I2 is decreased.

As in the case of Embodiment 1, when a gate length L of the NMOSFET m4b is increased so as to be longer than that of conventional MOSFETs, a leakage current in the inverter logic circuit I2 can be further decreased. That is, even if a gate length of each of the NMOSFET m4a and the NMOS-FET m4a is not increased, a leakage current in the inverter logic circuit I2 can be decreased by adjusting the gate length of the NMOSFET m4b. Thus, a leakage current in the inverter logic circuit I2 can be decreased so as not to increase gate capacitance of the NMOSFET m4a and the NMOSFET m4c.

For the purpose of decreasing a leakage current, the serial homogeneous FET d3 is applicable to a flip-flop circuit which is a data storing circuit. In such a case, the inverter logic circuit I2 can be used as each of the inverter logic circuits I11–I16 of the D flip-flop circuit FF1 illustrated in FIG. 4A. In the D flip-flop circuit FF1 realized in this manner, each of the inverter logic circuits I11–I14 is configured by serially-connected FETs, and thus a leakage current in the D flip-flop circuit FF1 can be decreased for the above reasons described with reference to FIG. 2. Moreover, no specific signal is required for causing the D flip-flop circuit FF1 to be placed on standby, and thus it is possible to decrease an unwanted leakage current in the D flip-flop circuit FF1 when not in operation. It is also possible to operate the D flip-flop circuit FF1 at an extremely low voltage so as to retain data.

The serial homogeneous FET d3 is also applicable to the pass transistor logic circuit P1 illustrated in FIG. 5. By applying the inverter logic circuit I2 including the serial homogeneous FET d3 illustrated in FIG. 6B to the buffer (inverter) circuit I17 included in the pass transistor logic circuit P1, in a similar manner to the examples described above, it is possible to operate the pass transistor logic circuit P1 at an extremely low voltage and to decrease a leakage current in the pass transistor logic circuit P1 without additionally using any specific circuits, devices, or control signals.

In each of the above-described examples, by using a serial homogeneous FET only for a MOSFET corresponding to the NMOSFET m4 of the inverter circuit I2, a leakage current in a semiconductor integrated circuit can be decreased while such a semiconductor integrated circuit can be operated at low voltage. In the inverter circuit I2 (or corresponding circuits in the different examples), no measures to decrease an off-leakage current in the PMOSFET m3 (or corresponding MOSFETs) are taken. As for the NMOSFET m4, by using a serial homogeneous FET for the PMOSFET m3 (or corresponding MOSFETs), it is possible to further decrease a leakage current in a semiconductor integrated circuit including the PMOSFET m3 (or the corresponding MOSFETs).

Figure 6C:
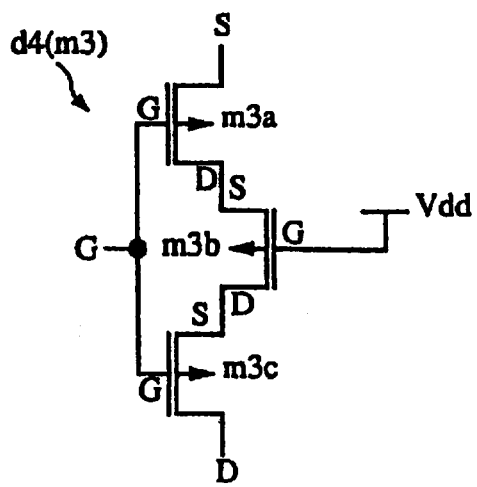
FIG. 6C is a diagram illustrating a structure of a PMOSFET m3 according to Embodiment 2 of the present invention.

FIG. 6C illustrates a structure of the PMOSFET m3. The PMOSFET m3 includes three serially-connected MOSFETs of the same channel-type: a PMOSFET m3a (a first MOSFET); a PMOSFET m3b (a second MOSFET); and a PMOSFET m3c (a third MOSFET). The PMOSFET m3a and the PMOSFET m3c are serially connected to each other, and the respective gates of the PMOSFET m3a and the PMOSFET m3c are connected to each other (hereinafter, this structure is referred to as "a serial homogeneous FET d4"). In the serial homogeneous FET d4, a drain of the PMOSFET m3a is connected to a source of the PMOSFET m3b. A drain of the PMOSFET m3b is connected to a source of the PMOSFET m3c. The respective gates of the PMOSFET m3a and the PMOSFET m3c are connected to the input terminal 11 (FIG. 6A). A drain of the PMOSFET m3c is connected to the output terminal 13 (FIG. 6A). A source of the PMOSFET m3c is connected to the power line Vdd (FIG. 6A). A gate of the PMOSFET m3b is connected to the power line Vdd which has a sufficient potential to turn on the PMOSFET m3b.

In Embodiment 2, if there is a possibility that either of the NMOSFET m4 or the PMOSFET m3 is turned off during a standby operation of the inverter logic circuit I2, the serial homogeneous FET d3 illustrated in FIG. 6B or the serial homogeneous FET d4 illustrated in FIG. 6C is applied to the one(s) to be turned off. This allows a decrease of a leakage current in the inverter logic circuit I2 while there is a minimum increase in an area of the inverter logic circuit I2.

(Embodiment 3)

A semiconductor integrated circuit according to Embodiment 3 of the present invention is described using examples of inverter logic circuits included in the semiconductor integrated circuit to which the present invention is applied.

Figure 7A:
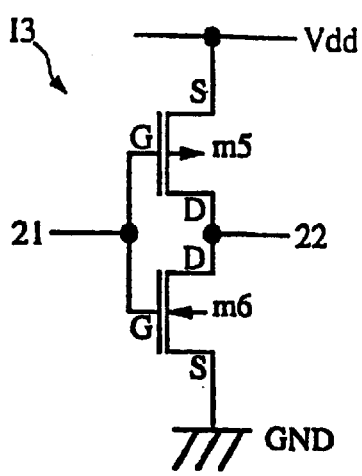
FIG. 7A is a diagram illustrating a structure of an inverter logic circuit I3 according to Embodiment 3 of the present invention.

FIG. 7A illustrates a structure of an inverter logic circuit I3 according to Embodiment 3 of the present invention. The inverter logic circuit I3 includes a PMOSFET m5 and an NMOSFET m6. A source of the PMOSFET m5 is connected to a power line Vdd which is a high potential power line. A gate of the PMOSFET m5 is connected to an input terminal 21 of the inverter logic circuit I3. A drain of the PMOSFET m5 is connected to a drain of the NMOSFET m6 and an output terminal 22 of the inverter logic circuit I3.

A source of the NMOSFET m6 is connected to a ground line GND which is a low potential power line. A gate of the NMOSFET m6 is connected to the input terminal 21. The drain of the NMOSFET m6 is connected to the drain of the PMOSFET m5 and the output terminal 22.

Figure 7B:
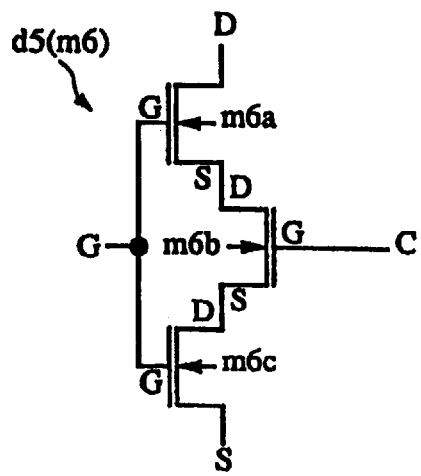
FIG. 7B is a diagram illustrating a structure of an NMOSFET m6 according to Embodiment 3 of the present invention.

FIG. 7B illustrates a structure of the NMOSFET m6. The NMOSFET m6 includes three serially-connected MOSFETs of the same channel-type: an NMOSFET m6a (a first MOSFET); an NMOSFET m6b (a second MOSFET); and an NMOSFET m6c (a third MOSFET). Respective gates of the NMOSFET m6a and the NMOSFET m6c are connected to each other (hereinafter, this structure is referred to as "a serial homogeneous FET d5"). In the serial homogeneous FET d5, a source of the NMOSFET m6a is connected to a drain of the NMOSFET m6b. A source of the NMOSFET m6b is connected to a drain of the NMOSFET m6c. The respective gates of the NMOSFET m6a and the NMOSFET m6c are connected to the input terminal 21 (FIG. 7A). A drain of the NMOSFET m6a is connected to the output terminal 22 (FIG. 7A). A source of the NMOSFET m6c is connected to the ground line GND (FIG. 7A). A gate of the NMOSFET m6b receives a prescribed control signal differing from a control signal input to a gate of the inverter logic circuit I3 which serves as a control terminal C.

During normal operation of the inverter logic circuit I3, when a HIGH-state signal is input to the control terminal C of the inverter logic circuit I3, the NMOSFET m6b is turned on. In this case, when a LOW-state signal is input to the input terminal 21, the NMOSFET m5 is turned on and the NMOSFET m6 is turned off, so that a HIGH-state signal is output from the output terminal 22. Accordingly, during normal operation of the inverter logic circuit I3, the inverter logic circuit I3 is operated in a similar manner to an operation of the inverter logic circuit I2 described above with reference to FIG. 6A. Also in this case, the inverter logic circuit I3 includes only FETs having a threshold voltage which is lower than that of an ordinary FET, and thus the inverter logic circuit I3 can be operated at an extremely low power voltage.

During a standby operation of the inverter logic circuit I3, when a LOW-state signal is input to the control terminal C, the NMOSFET m6b is turned off. Thus, the NMOSFET m6a has load resistances provided by the NMOSFET m6b and the NMOSFET m6c. In this case, a leakage current flowing through the inverter logic circuit I3 is extremely low in comparison to the case where the NMOSFET m6 is a single MOSFET or the case where the NMOSFET m6 is the serial homogeneous FET d1 illustrated in FIG. 1B. In Embodiment 3 of the present invention, load capacitance of an input gate of the NMOSFET m6 is the sum of gate capacitance of two MOSFETs (i.e., the NMOSFET m6a and the NMOSFET m6c), as in the case of the serial homogeneous FET d1 of the inverter logic circuit I1. In Embodiment 3, resistance is serially added to the inverter logic circuit I3 while the NMOSFET m6b is turned off, so that a leakage current in the inverter logic circuit I3 is decreased in comparison with the serial homogeneous FET d3 of the inverter logic circuit I2.

As in the case of Embodiment 2, when a gate length L of the NMOSFET m6b is increased so as to be longer than that of conventional MOSFETs, a leakage current in the inverter logic circuit I2 can be further decreased. That is, even if a gate length of each of the NMOSFET m6a and the NMOSFET m6c is not increased, a leakage current in the inverter logic circuit I3 can be decreased by adjusting the gate length of the NMOSFET m6b. Thus, a leakage current in the inverter logic circuit I3 can be decreased so as not to increase gate capacitance of the NMOSFET m6a and the NMOSFET m6c.

An example of applying the serial homogeneous FET d3 illustrated in FIG. 6B to a D flip-flop circuit, which is a data storing circuit, is described with reference to FIG. 8.

Figure 8:
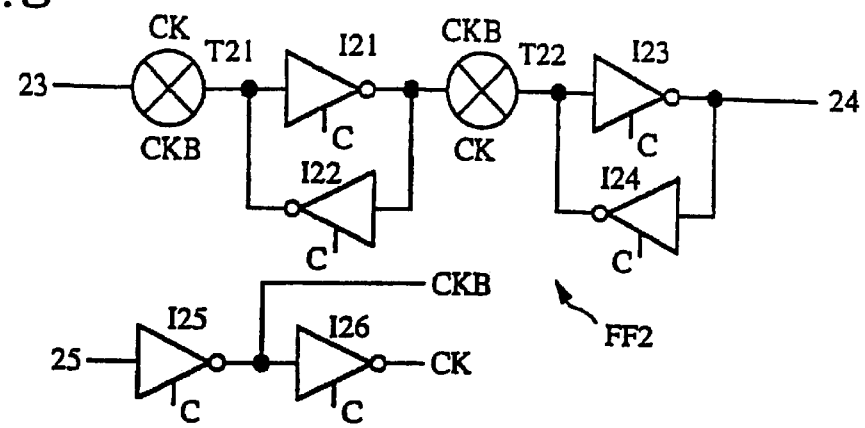
FIG. 8 is a diagram illustrating a structure of a D flip-flop circuit FF2 according to Embodiment 3 of the present invention.

FIG. 8 illustrates a structure of a D flip-flop circuit FF2.

The D flip-flop circuit FF2 of FIG. 8 includes a data input terminal 23, a data output terminal 24, a clock signal input terminal 25, transmission gates T21 and T22, and inverter logic circuits I21, I22, I23, I24, I25, and I26.

The data input terminal 23 is connected to an input terminal of the transmission gate T21. The data output terminal 24 is connected to an output terminal of the inverter logic circuit I23 and an input terminal of the inverter logic circuit I24. The clock signal input terminal 25 is connected to an input terminal of the inverter logic circuit I25. An output terminal of the transmission gate T21 is connected to an input terminal of the inverter logic circuit I21 and an output terminal of the inverter logic circuit I22. An output terminal of the inverter logic circuit I21 and an input terminal of the inverter logic circuit I22 are both connected to an input terminal of the transmission gate T22. An output terminal of the transmission gate T22 is connected to an input terminal of the inverter logic circuit I23 and an output terminal of the inverter logic circuit I24. An output terminal of the inverter logic circuit I25 and an input terminal of the inverter logic circuit I26 are both connected to control terminals CKB of the transmission gates T21 and T22. An output terminal of the inverter logic circuit I26 is connected to control terminals CK of the transmission gates T21 and T22.

In the D flip-flop circuit FF2, the inverter logic circuits I21 and I22 serve together as a data retainer circuit which is a master stage, and the inverter logic circuits I23 and I24 serve together as a data retainer circuit which is a slave stage. The inverter logic circuits I25 and I26 serve as a clock signal generator circuit.

Each of the transmission gates T21 and T22 has a structure similar to that of each of the transmission gates T1 and T2 illustrated in FIG. 4B, and thus description thereof is omitted.

Respective structures of the inverter logic circuits I21–I26 are the same as the structure of the inverter logic circuit I3 illustrated in FIG. 7A. In the D flip-flop circuit FF2, each of the inverter logic circuit I21–I24 includes a serial homogeneous FET (serial homogeneous FET d5 illustrated in FIG. 7B). Thus, as described above with reference to FIG. 2, a leakage current in the D flip-flop circuit FF2 can be decreased. Moreover, no specific signal is required for causing the D flip-flop circuit FF2 to be placed on standby, and thus it is possible to decrease an unwanted leakage current in the D flip-flop circuit FF2 when not in operation. It is also possible to operate the D flip-flop circuit FF2 at an extremely low voltage so as to retain data.

In the case where a control signal C is input to the D flip-flop circuit FF2 illustrated in FIG. 8, when the control signal C is in a HIGH state, the D flip-flop circuit FF2 performs normal operation, and when the control signal C is in a LOW state, the NMOSFETs m6b included in the inverters I21–I24 are turned off, so that a leakage current in the flip-flop circuit FF2 can be decreased. In this case, since the NMOSFETs m6b are turned off, feedback circuits (the inverters I22 and I24) are put on standby.

The D flip-flop circuit FF2 illustrated in FIG. 8 serves as a dynamic circuit which stores data according to gate capacitance of each of the inverters I21–I24. During a standby operation, a leakage current in the D flip-flop circuit FF2 is extremely low in comparison to that in a conventional D flip-flop circuit which does not have control terminals. Thus, it is highly advantageous to use the D flip-flop circuit FF2 as a dynamic circuit.

A case where Embodiment 3 of the present invention is applied to a pass transistor logic circuit is described below with reference to FIG. 9.

Figure 9:
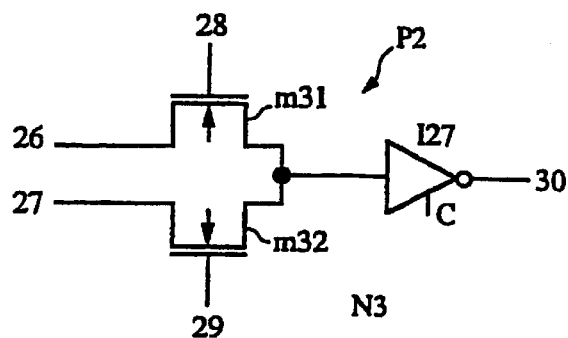
FIG. 9 is a diagram illustrating a structure of a pass transistor logic circuit P2 according to Embodiment 3 of the present invention.
Figure 10:
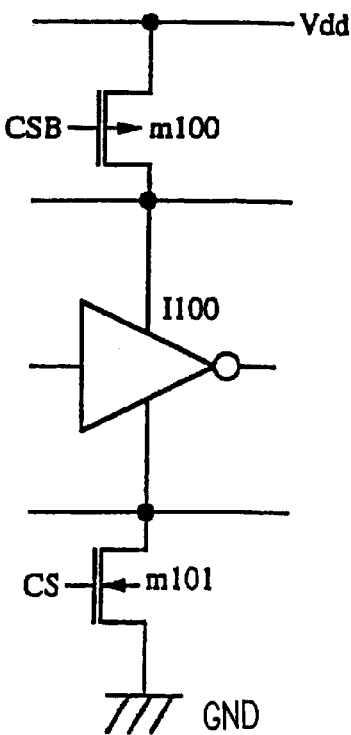
FIG. 10 is a circuit diagram illustrating a schematic structure of a conventional semiconductor integrated circuit.
Figure 11:
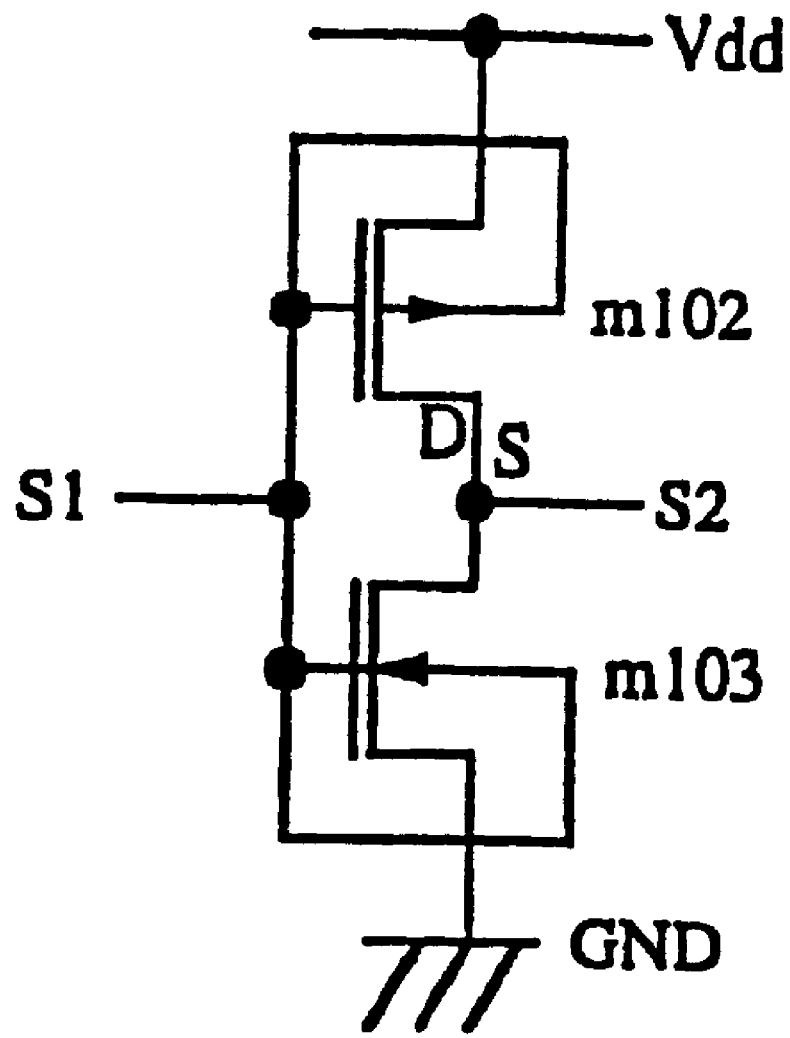
FIG. 11 is a circuit diagram illustrating a conventional inverter logic circuit.

FIG. 9 illustrates a structure of a pass transistor logic circuit P2. The pass transistor logic circuit P2 includes an NMOSFET m31, an NMOSFET m32, a buffer (inverter logic) circuit I27, signal input terminals 26, 27, 28 and 29, and an output terminal 30. A drain of the PMOSFET m31 is connected to the signal input terminal 26. A gate of the PMOSFET m31 is connected to the signal input terminal 28. A source of the PMOSFET m31 is connected to an input terminal of the buffer circuit I27. A drain of the PMOSFET m32 is connected to the signal input terminal 27. A gate of the PMOSFET m32 is connected to the signal input terminal 29. A source of the PMOSFET m32 is connected to the input terminal of the buffer circuit I27. An output terminal of the buffer circuit I27 is connected to the signal output terminal 30.

The pass transistor logic circuit P2 receives a logic signal output from other circuits in the same circuit network. The pass transistor logic circuit P2 amplifies the logic signal in an inverting manner using the buffer circuit I27 and outputs it to a circuit in a subsequent stage. By applying the inverter logic circuit I3 including the serial homogeneous FET illustrated in FIG. 7A to the buffer circuit I27, in a similar manner to the examples described above, it is possible to operate the pass transistor logic circuit P2 at an extremely low voltage and to decrease a leakage current in the pass transistor logic circuit P2 without additionally using any specific circuits, devices, or control signals.

In the case where the buffer circuit I27 includes the serial homogeneous FET d5 having the control terminals C illustrated in FIG. 7B and is applied to the pass transistor logic circuit P2, the pass transistor logic circuit P2 is put on standby by a control signal input to the control terminal C. Thus, a leakage current flowing through the pass transistor logic circuit P2 can be low.

In each of the above-described examples, by using a serial homogeneous FET only for a MOSFET corresponding to the NMOSFET m6 of the inverter circuit I3, a leakage current in a semiconductor integrated circuit can be decreased while such a semiconductor integrated circuit can be operated at low voltage. In the inverter circuit I3 (or corresponding circuits in the different examples), no measures to decrease an off-leakage current in the PMOSFET m5 (or corresponding MOSFETs) are not taken. As for the NMOSFET m6, by using a serial homogeneous FET for the PMOSFET m5 (or corresponding MOSFETs), it is possible to further decrease a leakage current in a semiconductor integrated circuit including the PMOSFET m5 (or the corresponding MOSFETs).

Figure 7C:
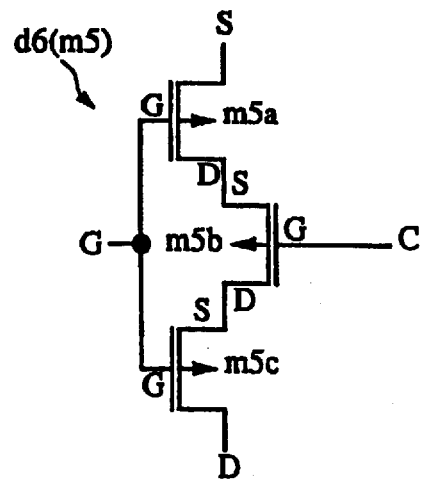
FIG. 7C is a diagram illustrating a structure of a PMOSFET m5 according to Embodiment 3 of the present invention.

FIG. 7C illustrates a structure of the PMOSFET m5. The PMOSFET m5 includes three serially-connected MOSFETs of the same channel-type: a PMOSFET m5a (a first MOSFET); a PMOSFET m5b (a second MOSFET); and a PMOSFET m5c (a third MOSFET). The PMOSFET m5a and the PMOSFET m5c are serially connected to each other, and the respective gates of the PMOSFET m5a and the PMOSFET m5c are connected to each other (hereinafter, this structure is referred to as "a serial homogeneous FET d6"). In the serial homogeneous FET d6, a drain of the PMOSFET m5a is connected to a source of the PMOSFET m5b. A drain of the PMOSFET m5b is connected to a source of the PMOSFET m5c. The respective gates of the PMOSFET m5a and the PMOSFET m5c are connected to the input terminal 21 (FIG. 7A). A drain of the PMOSFET m5c is connected to the output terminal 22 (FIG. 7A). A source of the PMOSFET m5c is connected to the power line Vdd (FIG. 7A). A gate of the PMOSFET m5b is connected to the power line Vdd so as to be turned on.

In Embodiment 3, if there is a possibility that either of the NMOSFET m6 or the PMOSFET m5 is turned off during a standby operation of the inverter logic circuit 13, the serial homogeneous FET d5 illustrated in FIG. 7B or the serial homogeneous FET d6 illustrated in FIG. 7C is applied to the one(s) to be turned off. This allows a decrease of a leakage current in the inverter logic circuit I3 while there is a minimum increase in an area of the inverter logic circuit I3.

The present invention provides circuit technology which provides the realization of any circuit produced using an ordinary MOS process technology to operate at low voltage and have characteristics such that a leakage current which may flow through the circuit during a standby operation is low. Embodiments 1–3 of the present invention can be applied to a SOI device circuit having characteristics such that a threshold voltage is low in order to operate the SOI device circuit at low voltage. Thus, the present invention is highly advantageous as technology for realizing a circuit which is operated at low voltage and has a low leakage current without performing threshold control by substrate bias control or without using multi-threshold device technology in which a high threshold device is additionally used for a circuit including such a device to have low leakage current characteristics.

According to the present invention, the following effects can be obtained.

(1) A semiconductor integrated circuit according to the present invention includes MOSFETs of at least one of N channel- and P channel-types where at least two MOSFETs included in a plurality of MOSFETs, which are provided in a channel between a high potential power line and a low potential power line, includes two serially-connected MOSFETs of the same channel-type in which their respective gates are connected to each other.

Accordingly, a leakage current flowing through the semiconductor integrated circuit can be greatly decreased, so that a leakage current in the semiconductor integrated circuit, when not in operation, can be decreased. Moreover, the leakage current flowing through the semiconductor integrated circuit can be decreased even if the semiconductor integrated circuit is produced by an ordinary integrated circuit production process without requiring any additional specific steps, e.g., a step for adding MOSFETs which operate at a high threshold voltage to the semiconductor integrated circuit, and a step for controlling a substrate voltage so as to change a threshold voltage of the MOSFETs. In this case, the semiconductor integrated circuit includes only FETs having an extremely low threshold voltage, and thus the semiconductor integrated circuit can be stably operated at an extremely low power voltage.

(2) The semiconductor integrated circuit according to the present invention may include a circuit which includes at least two MOSFETs having the same channel-type where the circuit is any one of a logic circuit, a data storing circuit, and a buffer circuit included in a pass transistor logic circuit.

Accordingly, a leakage current flowing through the semiconductor integrated circuit can be greatly decreased, so that a leakage current in the semiconductor integrated circuit, when not in operation, can be decreased. Moreover, no specific signal is required for causing the semiconductor integrated circuit to be placed on standby. Moreover, the semiconductor integrated circuit includes MOSFETs which operate at an extremely low threshold voltage, and thus no additional specific circuitry is used in the semiconductor integrated circuit. Accordingly, the semiconductor integrated circuit can be operated at an extremely low voltage so as to retain data.

(3) In the semiconductor integrated circuit according to the present invention, a gate length of each of the two MOSFETs of the same channel-type is longer than respective gate lengths of other MOSFETs included in the plurality of MOSFETs provided in the channel.

Accordingly, a leakage current flowing through the semiconductor integrated circuit can be decreased.

(4) A semiconductor integrated circuit according to the present invention includes MOSFETs of at least one type of N channel- and P channel-types where at least one set of MOSFETs included in a plurality of MOSFETs, which are provided in a channel between a high potential power line and a low potential power line, includes first through third MOSFETs of the same channel-type, the first through third MOSFETs being serially connected, respective gate electrodes of the first and third MOSFETs being connected to each other, and a gate electrode of the second MOSFET being connected to a section of the semiconductor integrated circuit which has a sufficient potential to turn on the second MOSFET.

Accordingly, the first MOSFET has load resistances provided by the second and third MOSFETs, and thus a leakage current flowing through the semiconductor integrated circuit can be extremely low. Moreover, the leakage current flowing through the semiconductor integrated circuit can be decreased even if the semiconductor integrated circuit is produced by an ordinary integrated circuit production process without requiring any additional specific steps, e.g., a step for adding MOSFETs which operate at a high threshold voltage to the semiconductor integrated circuit, and a step for controlling a substrate voltage so as to change a threshold voltage of the MOSFETs. In this case, the semiconductor integrated circuit includes only FETs which have extremely low threshold voltages, and thus the semiconductor integrated circuit can be stably operated at an extremely low power voltage.

(5) A semiconductor integrated circuit of the present invention includes MOSFETs of at least one of N channel- and P channel-types where at least one set of MOSFETs included in a plurality of MOSFETs, which are provided in a channel between a high potential power line and a low potential power line, includes first through third MOSFETs of the same channel-type, the first through third MOSFETs being serially connected, respective gate electrodes of the first and third MOSFETs being connected to each other, and a gate electrode of the second MOSFET receiving a control signal differing from that input to the respective gate electrodes of the first and third MOSFETs.

Accordingly, the first MOSFET has load resistances provided by the second and third MOSFETs, and thus a leakage current flowing through the semiconductor integrated circuit can be extremely low. Moreover, the leakage current flowing through the semiconductor integrated circuit can be decreased even if the semiconductor integrated circuit is produced by an ordinary integrated circuit production process without requiring any additional specific steps, e.g., a step for adding MOSFETs which operate at a high threshold voltage to the semiconductor integrated circuit, and a step for controlling a substrate voltage so as to change a threshold voltage of the MOSFETs. In this case, the semiconductor integrated circuit includes only FETs which have extremely low threshold voltages, and thus the semiconductor integrated circuit can be stably operated at an extremely low power voltage.

(6) The semiconductor integrated circuit according to the present invention includes a circuit which includes at least one set of the first through third MOSFETs of the same channel-type, in which the circuit is any one of a logic circuit, a data storing circuit, and a buffer circuit included in a pass transistor logic circuit.

Accordingly, a leakage current flowing through the semiconductor integrated circuit can be greatly decreased, so that a leakage current in the semiconductor integrated circuit, when not in operation, can be decreased. Moreover, no specific signal is required for causing the semiconductor integrated circuit to be placed on standby. Moreover, the semiconductor integrated circuit includes MOSFETs which operate at an extremely low threshold voltage, and thus no additional specific circuitry is used in the semiconductor integrated circuit. Accordingly, the semiconductor integrated circuit can be operated at an extremely low voltage so as to retain data.

(7) In the semiconductor integrated circuit according to the present invention, a gate length of the second MOSFET is longer than respective gate lengths of the first and third MOSFETs included in the plurality of MOSFETs provided in the channel.

Accordingly, even if the respective gate lengths of the first and third MOSFETs are not increased, a leakage current flowing through the semiconductor integrated circuit can be decreased by adjusting the gate length of the second MOSFET.

(8) The semiconductor integrated circuit according to the present invention is formed on a SOI substrate.

Accordingly, the present invention is highly advantageous as technology for realizing a circuit which is operated at a low voltage and has a low leakage current without performing a threshold control by substrate bias control or without using multi-threshold device technology in which a high threshold device is additionally used for a circuit including such a device to have low leakage current characteristics.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor integrated circuit comprising MOSFETs having low threshold voltages of at least one of N channel- and P channel-types, wherein at least two MOSFETs included in a plurality of MOSFETs, which are provided in a channel between a high potential power line and a low potential power line, includes two serially-connected MOSFETs of the same channel-type in which their respective gates are connected to each other.

2. The semiconductor integrated circuit according to claim 1, comprising a circuit which includes at least two MOSFETs of the same channel-type, wherein the circuit is any one of a logic circuit, a data storing circuit, and a buffer circuit included in a pass transistor logic circuit.

3. The semiconductor integrated circuit according to claim 1, wherein a gate length of each of the two MOSFETs of the same channel-type is longer than respective gate lengths of other MOSFETs included in the plurality of MOSFETs provided in the channel.

4. The semiconductor integrated circuit according to claim 1 being formed on a SOI substrate.

5. A semiconductor integrated circuit comprising MOSFETs having low threshold voltages of at least one type of N channel- and P channel-types, wherein:

at least one set of MOSFETs included in a plurality of MOSFETs, which are provided in a channel between a high potential power line and a low potential power line, includes first through third MOSFETs of the same channel-type;

the first through third MOSFETs are serially connected;

respective gate electrodes of the first and third MOSFETs are connected to each other; and a gate electrode of the second MOSFET is connected to a section of the semiconductor integrated circuit which has a sufficient potential to turn on the second MOSFET.

6. The semiconductor integrated circuit according to claim 5, comprising a circuit which includes at least one set of the first through third MOSFETs of the same channel-type, wherein the circuit is any one of a logic circuit, a data storing circuit, and a buffer circuit included in a pass transistor logic circuit.

7. The semiconductor integrated circuit according to claim 5, wherein a gate length of the second MOSFET is longer than respective gate lengths of the first and third MOSFETs included in the plurality of MOSFETs provided in the channel.

8. The semiconductor integrated circuit according to claim 5 being formed on a SOI substrate.

9. A semiconductor integrated circuit comprising MOSFETs having low threshold voltages of at least one of N channel- and P channel-types, wherein:

at least one set of MOSFETs included in a plurality of MOSFETs, which are provided in a channel between a high potential power line and a low potential power line, includes first through third MOSFETs of the same channel-type;

the first through third MOSFETs are serially connected;

respective gate electrodes of the first and third MOSFETs are connected to each other; and a gate electrode of the second MOSFET receives a control signal differing from an input to the respective gate electrodes of the first and third MOSFETs.

10. The semiconductor integrated circuit according to claim 9, comprising a circuit which includes at least one set of the first through third MOSFETs of the same channel-type, wherein the circuit is any one of a logic circuit, a data storing circuit, and a buffer circuit included in a pass transistor logic circuit.

11. The semiconductor integrated circuit according to claim 9, wherein a gate length of the second MOSFET is longer than respective gate lengths of the first and third MOSFETs included in the plurality of MOSFETs provided in the channel.

12. The semiconductor integrated circuit according to claim 9 being formed on a SOI substrate.

13. The semiconductor integrated circuit according to claim 1, wherein the threshold voltage of each of the MOSFETs is set so as to be approximately 0.15 V.

14. The semiconductor integrated circuit according to claim 5, wherein the threshold voltage of each of the MOSFETs is set so as to be approximately 0.15 V.

15. The semiconductor integrated circuit according to claim 9, wherein the threshold voltage of each of the MOSFETs is set so as to be approximately 0.15 V.

* * * * *